United States Patent [19]

Geissberger et al.

[11] Patent Number: 4,782,032
[45] Date of Patent: Nov. 1, 1988

[54] METHOD OF MAKING SELF-ALIGNED GAAS DEVICES HAVING TIWN$_x$ GATE/INTERCONNECT

[75] Inventors: Arthur E. Geissberger; Robert A. Sadler; Matthew L. Balzan, all of Roanoke, Va.

[73] Assignee: ITT Gallium Arsenide Technology Center, a division of ITT Corporation, Roanoke, Va.

[21] Appl. No.: 2,083

[22] Filed: Jan. 12, 1987

[51] Int. Cl.$^4$ .................................. H01L 21/283
[52] U.S. Cl. .................................. 437/41; 437/39; 437/176; 437/171; 437/192; 437/201; 437/245; 437/912; 437/944; 148/DIG. 105; 357/15
[58] Field of Search .............. 29/571, 578, 580, 590, 29/591; 427/88, 89, 90, 91; 357/22, 15, 23; 437/40, 41, 39, 175, 176, 179, 184, 192, 201, 200, 245, 912, 944; 148/DIG. 105, DIG. 131

[56] References Cited

U.S. PATENT DOCUMENTS

| | | | |
|---|---|---|---|
| 4,213,840 | 7/1980 | Omori et al. | 29/591 X |
| 4,396,437 | 8/1983 | Kwok et al. | 148/1.5 |
| 4,491,860 | 1/1985 | Lim | 357/68 |
| 4,532,695 | 8/1985 | Schuermeyer | 29/571 |
| 4,566,026 | 1/1986 | Lee et al. | 357/71 |
| 4,574,298 | 3/1986 | Yamagishi et al. | 357/71 |
| 4,674,174 | 6/1987 | Kishita et al. | 29/578 |

FOREIGN PATENT DOCUMENTS 0211269 12/1982 Japan ............................ 29/578

OTHER PUBLICATIONS

H. Morkoc, J. Andrews, R. Sankaran, J. H. Dully, *Electronics Letters*, Aug. 3, 1978, vol. 14, No. 16, pp. 514–515.
H. M. Levy, R. E. Lee, *IEEE Electron Science Letters*, vol. EDL-4, No. 4, Apr. 1983, pp. 102–104.
S. K. Ghandhi, VLSI Fabrication Principles, John Wiley & Sons, 1983, pp. 419–430.

*Primary Examiner*—Brian E. Hearn
*Assistant Examiner*—T. N. Quach
*Attorney, Agent, or Firm*—Robert A. Walsh; Thomas N. Twomey; Mary C. Werner

[57] ABSTRACT

A method of making a field-effect transistor includes performing a first ion implant in at least one region of a gallium arsenide substrate and forming a metallization layer of titanium-tungsten nitride on the implanted substrate. A metallic gold masking layer is deposited on the metallization layer over the implanted region and that portion of the metallization layer which is unmasked is removed. A self-aligned source of implantation ions is beamed into the first implanted region in those areas not covered by the masking layer. The substrate is then annealed to activate the implanted region with the gold masking layer remaining to greatly reduce the resistance of the gate electrode of said field-effect transistor.

5 Claims, 2 Drawing Sheets

METHOD OF MAKING SELF-ALIGNED GAAS DEVICES HAVING TIWN$_x$ GATE/INTERCONNECT

BACKGROUND OF THE INVENTION

This invention relates to gallium arsenide (GaAs) field-effect transistors (FETs) and to methods of making such transistors. More particularly, this invention is concerned with a method for making self-aligned gate (SAG) GaAs transistors for use in the integrated circuit field.

Certain of the processing steps described in this application are included in a copending application entitled "A method of Making Self-Aligned GaAs Digital Integrated Circuits" filed on Oct. 21, 1985 as Ser. No. 789,523, now abandoned, for R. A. Sadler and A. E. Geissenberger 1-2.

The processes currently being used fall into two categories: (1) Thermally-Stable Refractory Gate (RG), and (2) Substantial Gate (GS). From a processing standpoint, the RG process is simpler and easier to manufacture than the SG process, but it places stringent requirements on the thermal stability of the Schottky gate metallization. The SG approach places no unusual thermal stability requirements on the gate metal but does require the difficult formation of a tri-layer gate substitution mask with a carefully controlled T-shaped profile.

While the RG approach may be superior overall to the SG approach, previous embodiments of the RG approach have suffered from the need to compromise some aspects of the process due to inadequate technology. In the SG process, gold is used as the refractory metal since it exhibits low resistivity and its thermal stability is sufficient for that process. However, in the RC process, the refractory metals used must be such that they can achieve the necessary thermal stability of the gate Schottky contact. Gold is not a suitable metal for this process. A major problem in the past has been the high resistivity of the refractory metals suitable for the RG process relative to that of gold. The high resistivity of the refractory gate metallization complicates the RG approach in that the first level interconnect metal, which must have lower resistivity than possible with a refractory metal, is defined by an additional mask level rather than the gate mask level as in the SG process. Also the high gate resistance degrades the performance of RG processed FETs, which precludes using this highly manufacturable process to fabricate analog circuits.

OBJECTS OF THE INVENTION

It is therefore an object of the present invention to provide a self-aligned gate type GaAs field-effect transistor which overcomes the disadvantages of the prior art.

It is an additional object to provide a refractory gate metallization which simultaneously provides both a high-temperature stable Schottky barrier and an equally high-temperature stable diffusion barrier to gold (Au).

It is a still further object of the present invention to use Au as an etch mask to fabricate a T-gate structure for use as a self-aligned implantation mask and leave the Au in place during the n+ activation anneal to reduce the gate resistance of the FET. (This precludes the current step of removing the Ni etch mask before the n+ anneal, and so it reduces the number of processing steps.)

It is yet another object of the present invention to use the refractory metal/Au layered metal for both the gate metal and first-level interconnect metal. This increases the throughput of producing GaAs ICs and reduces the cost of fabrication.

It is still another object of the present invention to improve the performance of GaAs FETs fabricated using the RG approach by reducing the gate resistance.

It is yet another object to allow the application of the highly manufacturable RG process to the fabrication of analog FETs and MMICS.

SUMMARY OF THE INVENTION

These objects and others which will become apparent hereinafter are accomplished by the present invention which provides a process for making a field-effect transistor comprising the step of forming a gate metallization layer on said substrate which layer is fabricated from titanium-tungsten nitride (TiWN$_X$) and used as a diffusion barrier for said transistor.

BRIEF DESCRIPTION OF THE DRAWING

The above-mentioned and other features and objects of this invention will become more apparent by reference to the following description taken in conjunction with the accompanying drawings in which.

DETAILED DESCRIPTION OF THE PREFERRED EMBODIMENT

Figure 1:
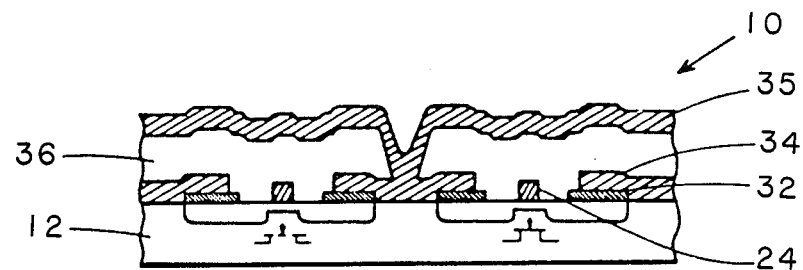
FIG. 1 is a schematic sectional view of a field-effect transistor produced in accordance with the present invention.

FIG. 1 shows the structure of a self-aligned gate field-effect transistor in accordance with the present invention generally indicated by 10.

Figure 4:
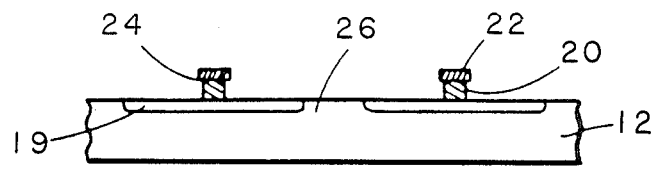

As indicated above, certain of the processes to be described correspond to processes described in the above noted patent application except that the metallization layer 20 of FIG. 4 of the copending application is changed to provide additional advantages as well as other modifications to be described.

Figure 2:
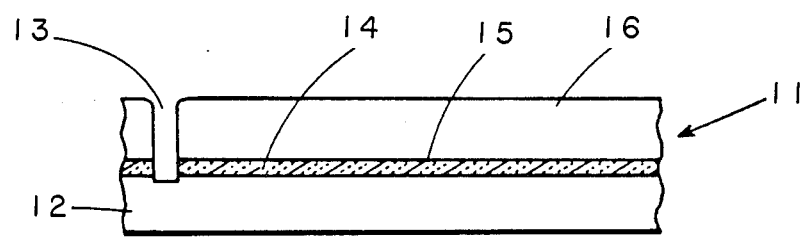
FIGS. 2 through 7 show the steps of forming a field-effect transistor in accordance with this invention.

Referring to FIG. 2, processing of a semiconductor wafer 11 will now be described. A gallium arsenide (GaAs) substrate 12 is initially cleaned in solvents and then etched to remove that portion of the substrate 12 which may have been damaged by the use of a mechanical slurry polishing process. It has been found that by removing at least approximately 5 um from each of the substrate surfaces the damaged portion will be removed and improved electrical properties will result. A problem in removing the material from the substrate is that a pitted or rough-textured surface may result with certain etchants. A preferred etchant which avoids this problem is a mixture of sulfuric acid, hydrogen peroxide and water ($H_2SO_4:H_2O_2:H_2O$) in a ratio of 5:1:1, used at a temperature in the range of approximately 30°–40° C. This etchant does not damage the wafer 11 and leaves a smooth finish on the surfaces of the wafer 11 which aids in further processing of the wafer, especially when performing photolithography.

A dielectric layer 14 which will serve as a passivation layer for the GaAs is formed on one surface of the substrate 12 with 900 Å or less of a suitable dielectric material. The preferred materials for the dielectric layer 14 are silicon nitride (SiN), silicon oxy-nitride (SiON) or silicon dioxide (SiO$_2$). The formation of the dielectric layer 14 protects the substrate surface by isolating it from photoresist residues during later processing. The dielectric layer 14 may, however, be eliminated so that ion implants are made directly into the bare GaAs surface.

A photoresist layer 16 is formed on one surface 15 of the dielectric layer 14. The photoresist layer 16 is patterned for registration marks 13 which will serve to align masks on the wafer 11 for patterning implant areas later in the process. The pattern of registration marks 13 are etched into the dielectric layer 14 and then into the underlying GaAs substrate 12. After etching, the photoresist layer 16 is removed, preferably with an oxygen plasma.

Figure 3:
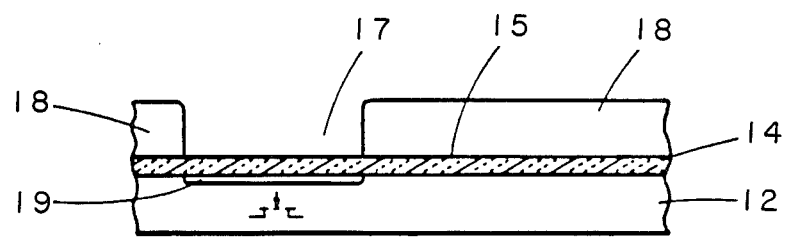

Another photoresist layer 18 is formed on the surface 15 as shown in FIG. 3. The photoresist layer 18 is patterned to form one or more windows 17 for selective ion implantation through the dielectric layer 14 into the underlying GaAs substrate 12. Patterning is performed in any known manner. Typically, a photographic mask having the desired pattern is positioned on the photoresist layer 18, aligning registration marks on the mask with the registration marks on the substrate 12. The photoresist 18 is exposed to light through the mask, and then the mask is removed. A solvent is applied so that the exposed areas of the resist are dissolved and washed away and the unexposed resist remains to serve as an implant mask.

The ion implantation step is performed in any known manner. In one method, the wafer 11 is supported in a vacuum chamber and a beam of ions is uniformly swept over it and implanted into the GaAs substrate 12 through the window 17. The implanted region is indicated at 19. The material of the dielectric layer 14 has an amorphous structure, thus minimizing planer channeling effects of the arriving ions through the layer 14. If somewhat steeper implant profiles are desired, the dielectric layer 14 may be eliminated and the implant made directly into the GaAs substrate 12. After the implant is performed, the photoresist layer 18 is removed in an oxygen plasma.

Additional selective implant steps may be performed by forming another photoresist layer on top of the dielectric layer 14, patterning the photoresist layer to form window areas and implanting the desired material through the window area into the dielectric layer 14 and into the GaAs substrate 12. The photoresist layer 18 is therafter removed. Thus, many different types of active and passive devices can be fabricated on the same wafer, for example, enhancement-mode and depletion-mode FETs, diodes and resistors.

After completing the desired selective implant steps, the dielectric layer 14 is removed in hydrogen fluoride (HF). A metallization layer 20 is formed on a surface 26 which is the implanted surface of the wafer 11. The metallization layer 20 is formed of titanium-tungsten nitride (TiWN$_X$). This layer 20 departs from the metal layer 20 of the copending application. In that application the layer 20 was formed by the sputter deposition of titanium-tungsten to a depth of 2000 Å.

One method of formation of the layer 20 is accomplished by reactively sputtering a TiW (30 atomic percent Ti) target in a nitrogen/argon plasma. The metallization layer 20 acts as a diffusion barrier between the gold which will be deposited on the metallization layer during subsequent processing, and the gallium arsenide substrate 12. Unexpectedly, it has been found that by changing the atomic percent of nitrogen, dramatically increased efficiency of the layer as a diffusion barrier can be achieved. A N/(N+Ar) flow ratio of ¼ is preferred, but a range of 1/10 to 1/1 will also be adequate. By maintaining the nitrogen ratio in this range, an atomic percent of nitrogen results which enables the metallization layer 20 to withstand a subsequent annealing step of approximately 850° C. for at least 20 minutes without breakdown of its barrier function.

Referring to FIG. 4, the next step in wafer processing is the patterning of the gate structures 24 which begins with the formation of another masking level on the TiWN$_X$ layer 20. This masking level is a metal etch mask 22 fabricated from gold and formed by liftoff in the following manner. A high resolution positive photoresist mask is positioned on top of the TiWN$_X$ layer 20. The positive photoresist mask has openings which define the regions where a metal is to be deposited which will form the etch mask 22. The metal for the etch mask 22 is evaporated on the positive photoresist mask in such a manner that the openings in the mask are filled. After evaporation, the photoresist mask is lifted off and the metallization remaining on the TiWN$_X$ layer 20 defines the metal etch mask 22. As indicated, the preferred material for the etch mask 22 is gold and the metal etch mask 22 is not removed out but remains in place whereby it greatly reduces the resistance of the gate.

It has been found that the use of a high-resolution positive photoresist to define a metal etch mask by liftoff enables gate linewidths of 1 μm or less to be defined much more easily than with the use of a photoresist etch mask. In addition, the metal etch mask 22 serves as an excellent implant mask as discussed below. This high resolution positive photoresist/liftoff step is performed again in subsequent processing of the wafer 11.

The underlying TiWN$_X$ layer 20 is then reactive-ion etched, using the metal mask 22, in a fluorine-based plasma. The plasma will etch the layer 20 in the regions not covered by the metal etch mask 22 and will also undercut the masked region to form T-shaped gate structures 24 as shown in FIG. 4. The amount of plasma undercut can be controlled by varying the plasma etch parameters. This can be accomplished by initially etching at low pressure to set an anisotropic profile, then increasing the pressure to achieve a faster plasma undercut.

Figure 5:
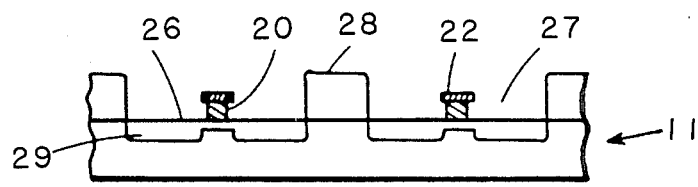

Following the gate patterning, a photoresist mask is formed on the surface 26 to define regions 29 for self-aligned ion implant as shown in FIG. 5. The term "self-aligned" is used since the mask 22 acts as a barrier to ion implantation by an ion beam and thus defines the limits of heavily doped regions in the substrate. While n-type doping levels are used for the initial channel implant at a level which will form good Schottky contact, much higher levels of doping (n+) are used during this implant step to facilitate ohmic contact. Although p and p+ implants may be used for Schottky contact and ohmic contact, respectively, n-type doping permits much faster carrier transport.

The photoresist mask 28 is formed by depositing a layer of a positive photoresist on the wafer 11 and exposing the photoresist 28 through a mask in those areas in which implant is desired. The mask and the exposed portion of the photoresist are removed. Windows 27 for the high-dose ion implant are thereby formed on the surface 26 of the wafer 11. The metal etch mask 22 serves as a self-aligned structure for the ions which are directed to the window regions. The ions will be implanted in the regions at both sides of the gate structures 24, with a small lateral separation between each gate edge and adjacent n+ region. The metal etch mask 22 allows the creation of an implant-to-implant spacing larger than the gate length. This is an important feature of an optimized GaAs SAG process, since only by controlling the differences between these two dimensions can the device be optimized in the trade-off between gate capacitance and breakdown voltage versus parasitic series resistance.

The n+ implant is masked from the region of the gate structures 24 by the etch mask 22, with the separation of each gate edge from the adjacent n+ region determined by the plasma undercut of the gate metal. The plasma undercut can be controlled accurately enough to allow optimization of the gate structure with respect to both gate capacitance and series resistance. The photoresist mask 28 is not removed, but remains in place in order to greatly reduce the resistance of the gate structure 24.

The wafer is then covered with approximately 3000 Å or less of a dielectric encapsulant 30 and annealed at approximately 850° for 20 minutes. The encapsulant 30 protects the GaAs wafer 11 from disassociation since the arsenic may vaporize at the high annealing temperature. Because the atomic percent of the nitrogen in the TiWN$_X$ enables the layer 20 to have unusually high thermal stability, only one annealing step for both channel and ion implants is needed. As discussed above, this allows optimum activation of each implant, higher electron mobility, reduced parasitic resistances and superior device characteristics. It also eliminates one annealing furnace and the need for two separate annealing process steps thereby resulting in decreased fabrication costs.

In order to ensure that the barrier properties of the TiWN$_X$ layer 20 are maintained and not severely degraded during subsequent processing of the wafer 11, the dielectric encapsulant 30 is selected to be plasma enhanced chemical vapor deposited silicon oxy-nitride (SiON) having a refractive index (RI) in the range of 1.55 to 1.95. A 1.55 refractive index is preferred. To establish an index of refraction of the SiON film in the given range, the N$_2$O/SiH$_4$ gas flow ratio is adjusted during the deposition of the encapsulant film.

The next step is the formation of ohmic contacts 32 on the surface 26. This may be accomplished in either one of two ways. In one method the annealing encapsulant 30 is removed in hydrofluoric acid and contacts 32 are formed by evaporation and liftoff. The lift-off step is performed in the same manner as discussed hereinbefore with respect to the formation of the etch mask 22.

Figure 6:
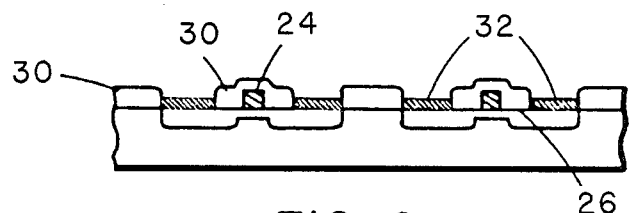

In a second preferred method as shown in FIG. 6 the annealing encapsulant 30 is left in place on the wafer 11 and embedded contacts 32 are formed by plasma etching the ohmic contact patterns through the encapsulant to the surface 26, then evaporating the metallization into the etched pattern and lifting off the pattern.

Preferred materials for the contacts 32 are a first layer of a gold-germanium compound overlayed with nickel. While the first method is simpler from a processing standpoint, the second method has the advantage of providing complete gate passivation, leading to greater device reliability. With either approach, the material of the contacts 32 may be deposited by sputtering rather than evaporation, with the advantage of better surface cleaning and more reproducible contact properties.

In either case, the contacts 32 are alloyed into the GaAs surface 26 by rapidly heating to 400° for 10 seconds, preferably with quartz-halogen tungsten lamps.

Figure 7:
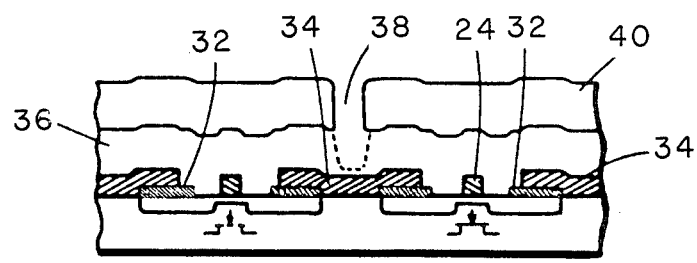

Referring to FIG. 7, after the ohmic contacts 32 are alloyed, a first-level conductive interconnect metal layer 34 is formed on the surface 15. This metal layer 34 overlays the ohmic contacts 32 and makes connection to the small gate pads at the end of each gate finger.

The layer 34 is formed by reactively sputtering a TiW target in a nitrogen/argon plasma and by the same process as employed for formation of the layer 20. The Ti of the target has an atomic percent of 30. Here again as in layer 20, the ratio of the N/(N+Ar) flowing into the sputter system is adjusted so that the atomic percent of nigrogen will produce a ratio in the range of 1/10 to 1/1 N/(N+Ar), with a preferred ratio of ¼.

After deposition of the TiWN$_X$ portion of the layer 34, the wafer 11 is transferred to a vacuum system where either titanium (Ti) or molybdenum (Mo) is evaporated onto the TiWN$_X$. Thereafter gold is evaporated onto the surface of the titanium or molybdenum. If deposition of the gold is carried out by sputter deposition, the intermediate titanium or molybdenum portion of the layer 34 may be eliminated since it serves as an adhesion layer between the sputter deposited TiWN$_X$ and the evaporated gold.

To form a second-level interconnect metallization, the wafer is next coated with a suitable dielectric material, to form a layer 36. An organic material such as polyimide may be used for the dielectric material. Other dielectric materials include inorganic materials such as plasma-deposited SiN or SiON. Contact vias 38 are opened in the dielectric layer 36 by plasma etching through a patterned photoresist layer 40. The contact vias 38 permit contact between the additional level of interconnect metallization with the underlying first-level interconnect metal 34 as shown in FIG. 7.

The second-level interconnect metal is deposited and patterned either by liftoff or etching, in such a way that it fills the via openings and contacts the first-level metal, as shown in FIG. 1.

Additional levels of interconnection may be formed in the same way, and, if desired, the wafer can be given a final dielectric passivation coating for scratch protection.

The wafer is then diced into chips.

While we have described above the principles of our invention in connection with specific apparatus, it is to be clearly understood that this description is made only by way of example and not as a limitation to the scope of our invention as set forth in the objects thereof and in the accompanying claims.

What is claimed is:

1. In a process for making a field-effect transistor including the heating of a gallium arsenide substrate having ions implanted therein, the improvement comprising the steps of:
   forming a Schottky gate metallization layer directed on said substrate which layer consists of titanium-tungsten nitride (TiWN$_X$) and forms a diffusion barrier for said transistor,
   wherein said gate metallization layer is formed by reactively sputtering a TiW (30 atomic percent Ti) target in a nitrogen/argon plasma having an adjustable flow ratio within the range of 1/10 to 1/1 of nitrogen (N) to nitrogen plus argon (N+Ar) N:(N+Ar) during formation of said layer by reactive sputtering to control the atomic percent of nitrogen in said layer, said process further including the steps of:

applying a dielectric encapsulant layer of silicon oxynitride (SiON) on said substrate and gate metalization layer and then annealing, and forming contacts on the implanted substrate by removing said encapsulant layer in predetermined areas on the substrate and depositing conductive material in said areas employing a first level conductive interconnect layer of titanium-tungsten nitride ($TiWN_x$).

2. The method according to claim 1, wherein said first level conductive interconnect layer is formed by reactively sputtering a TiW target in a nitrogen/argon plasma.

3. The method according to claim 2, wherein said target includes 30 atomic percent of Ti.

4. The method according to claim 1, including the further step of depositing a layer of Titanium or Molybdenum over said interconnect layer.

5. An improved process for the manufacture of a GaAs FET comprising:

providing a GaAs n-type channel region in a substrate;

forming a $TiWN_x$ layer on said substrate to cover said channel region and form a Schottky contact therewith by reactively sputtering a TiW target in a nitrogen/argon plasma having an N:(N+Ar) flow ratio of between about 1:10 and 1:1;

applying a layer of photoresist over said $TiWN_x$ layer and patterning said photoresist to expose said $TiWN_x$ at a gate location over said channel region;

forming an etch mask metal layer over said patterned photoresist and exposed $TiWN_x$ and employing a photoresist lift-off process to remove said photoresist and overlying portions of said etch mask metal layer to expose portions of said $TiWN_x$ layer, said etch mask metal being retained at said gate location;

employing a reactive ion etch to remove said exposed portions of said $TiWN_x$ layer and to undercut said retained etch mask metal; and introducing additional n-type impurities into said GaAs n-type channel region, employing said retained etch mask metal as an impurity introduction mask, to form source and drain regions laterally spaced from said $TiWN_x$ as a function of said undercut of said retained etch mask metal.

* * * * *